: US 10,460,962 B2
(45) Date of Patent: Oct. 29, 2019

(12) United States Patent
Wakiyama et al.

(54) SUBSTRATE PROCESSING APPARATUS

(71) Applicant: Tokyo Electron Limited, Tokyo (JP)

(72) Inventors: Terufumi Wakiyama, Koshi (JP);
Norihiro Ito, Koshi (JP)

(73) Assignee: TOKYO ELECTRON LIMITED,
Tokyo (JP)

( * ) Notice: Subject to any disclaimer, the term of this patent is extended or adjusted under 35 U.S.C. 154(b) by 49 days.

(21) Appl. No.: 15/805,311

(22) Filed: Nov. 7, 2017

(65) Prior Publication Data
US 2018/0130677 A1 May 10, 2018

(30) Foreign Application Priority Data

Nov. 8, 2016 (JP) .................... 2016-218314

(51) Int. Cl.
*B08B 3/08* (2006.01)
*H01L 21/67* (2006.01)
*H01L 21/687* (2006.01)

(52) U.S. Cl.
CPC ......... *H01L 21/67051* (2013.01); *B08B 3/08* (2013.01); *H01L 21/68742* (2013.01); *H01L 21/68764* (2013.01); *H01L 21/68785* (2013.01); *H01L 21/68792* (2013.01); *H01L 21/67173* (2013.01)

(58) Field of Classification Search
CPC ................. B08B 3/08; H01L 21/67051; H01L 21/67173; H01L 21/68742; H01L 21/68764; H01L 21/68785
USPC .................................. 134/33, 136, 144, 148
See application file for complete search history.

(56) References Cited

U.S. PATENT DOCUMENTS

2007/0119479 A1* 5/2007 Yoshihara ......... H01L 21/67051
134/18
2011/0048469 A1* 3/2011 Ogata ....................... B08B 3/04
134/33

FOREIGN PATENT DOCUMENTS

JP         2013-254959 A       12/2013

* cited by examiner

*Primary Examiner* — Levon J Shahinian
(74) *Attorney, Agent, or Firm* — Pearne & Gordon LLP

(57) ABSTRACT

A substrate processing apparatus can suppress a rear surface of a substrate from being contaminated when moving the substrate and a liquid supply unit upwards. When a lift pin 22 and a liquid supply pipe 40 are moved from a neighboring position where they are adjacent to a holding plate 30 to a distanced position, an elevating device 60 raises only the lift pin 22 for a time during which the first lifting member 61 is moved up to a preset position while being connected to the lift pin 22. The elevating device 60 raises the lift pin 22 and the liquid supply pipe 40 for a time during which the first lifting member 61 is raised from the preset position to the distanced position.

9 Claims, 4 Drawing Sheets

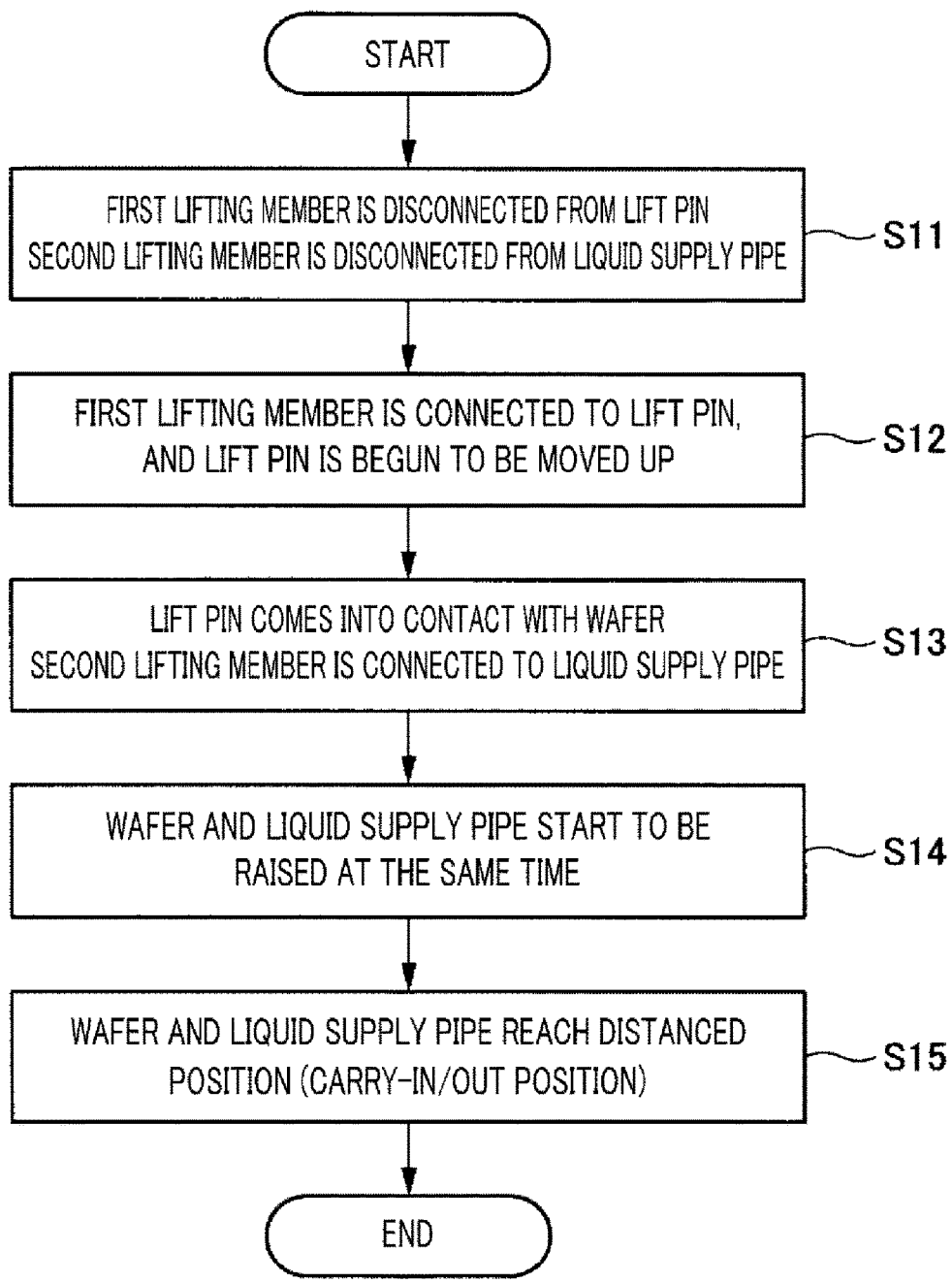

SUBSTRATE PROCESSING APPARATUS

CROSS-REFERENCE TO RELATED APPLICATION

This application claims the benefit of Japanese Patent Application No. 2016-218314 filed on Nov. 8, 2016, the entire disclosures of which are incorporated herein by reference.

TECHNICAL FIELD

The embodiments described herein pertain generally to a substrate processing apparatus configured to perform a liquid processing such as a cleaning processing or an etching processing on a substrate by supplying a processing liquid onto the substrate while holding and rotating the substrate in a substantially horizontal manner.

BACKGROUND

Conventionally, there is known a liquid processing apparatus configured to perform a liquid processing on a substrate (hereinafter, sometimes referred to as "wafer") such as a semiconductor wafer by supplying a processing liquid onto the substrate while holding and rotating the substrate in a substantially horizontal manner. For example, a liquid processing apparatus described in Patent Document 1 is equipped with a processing liquid supply pipe configured to supply a processing liquid such as pure water or a cleaning liquid onto a rear surface of the wafer.

In the liquid processing apparatus of Patent Document 1, a wafer is moved up and down between an upper position where a transfer of the wafer is performed and a lower position where a liquid processing of the wafer is performed. This moving up and down of the wafer is performed by a single elevating mechanism. This elevating mechanism is equipped with an interlocking member coupled to the processing liquid supply pipe to be moved up and down; and a connecting member connected to a lift pin plate configured to hold the wafer. By moving the interlocking member and the connecting member up and down, the wafer and the processing liquid supply pipe are moved up and down. With this elevating mechanism, for a time during which the interlocking member is separated from the connecting member when moving the interlocking member upwards, only the processing liquid supply pipe is raised while the wafer is stopped. Accordingly, a head portion of the processing liquid supply pipe is moved closer to the rear surface of the wafer.

In the liquid processing apparatus of Patent Document 1 as stated above, it is desirable that the head portion is placed closer to the wafer when the processing liquid is supplied. In this case, however, if a liquid remains at the head portion of the processing liquid supply pipe when moving the wafer from the lower position to the upper position, the remaining liquid may come into contact with the rear surface of the wafer W, so that the wafer is contaminated.

Patent Document 1: Japanese Patent Laid-open Publication No. 2013-254959

SUMMARY

In view of the foregoing, exemplary embodiments provide a substrate processing apparatus capable of suppressing a rear surface of a substrate from being contaminated when moving the substrate and a liquid supply unit upwards.

In one exemplary embodiment, there is provided a substrate processing apparatus including a holding plate provided with a first through hole and configured to hold a substrate; a rotation driving unit configured to rotate the holding plate; a lift pin provided above the holding plate and configured to support the substrate from below; a liquid supply unit provided to pass through the first through hole and configured to supply a liquid to a rear surface of the substrate held by the holding plate; and an elevating device configured to move the lift pin and the liquid supply unit up and down between at a neighboring position where the lift pin and the liquid supply unit are adjacent to the holding plate and the substrate is held and at a distanced position where the lift pin and the liquid supply unit are distanced upwards from the holding plate and the substrate is carried out. The elevating device includes a first lifting member configured to move the lift pin to the distanced position. The first lifting member is in a disconnected state with respect to the lift pin when the lift pin and the liquid supply unit are located at the neighboring position, and when the lift pin and the liquid supply unit are moved from the neighboring position to the distanced position, the first lifting member is turned from the disconnected state to a connected state where the first lifting member is connected to the lift pin. The elevating device raises only the lift pin for a time during which the first lifting member is moved up to a preset position while being connected to the lift pin, and raises the lift pin and the liquid supply unit for a time during which the first lifting member is raised from the preset position to the distanced position.

According to the exemplary embodiments, it is possible to suppress the rear surface of the substrate from being contaminated when moving the substrate and the liquid supply unit upwards.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 4 is a flowchart for describing an example of an ascending operation flow.

DETAILED DESCRIPTION

Figure 1:
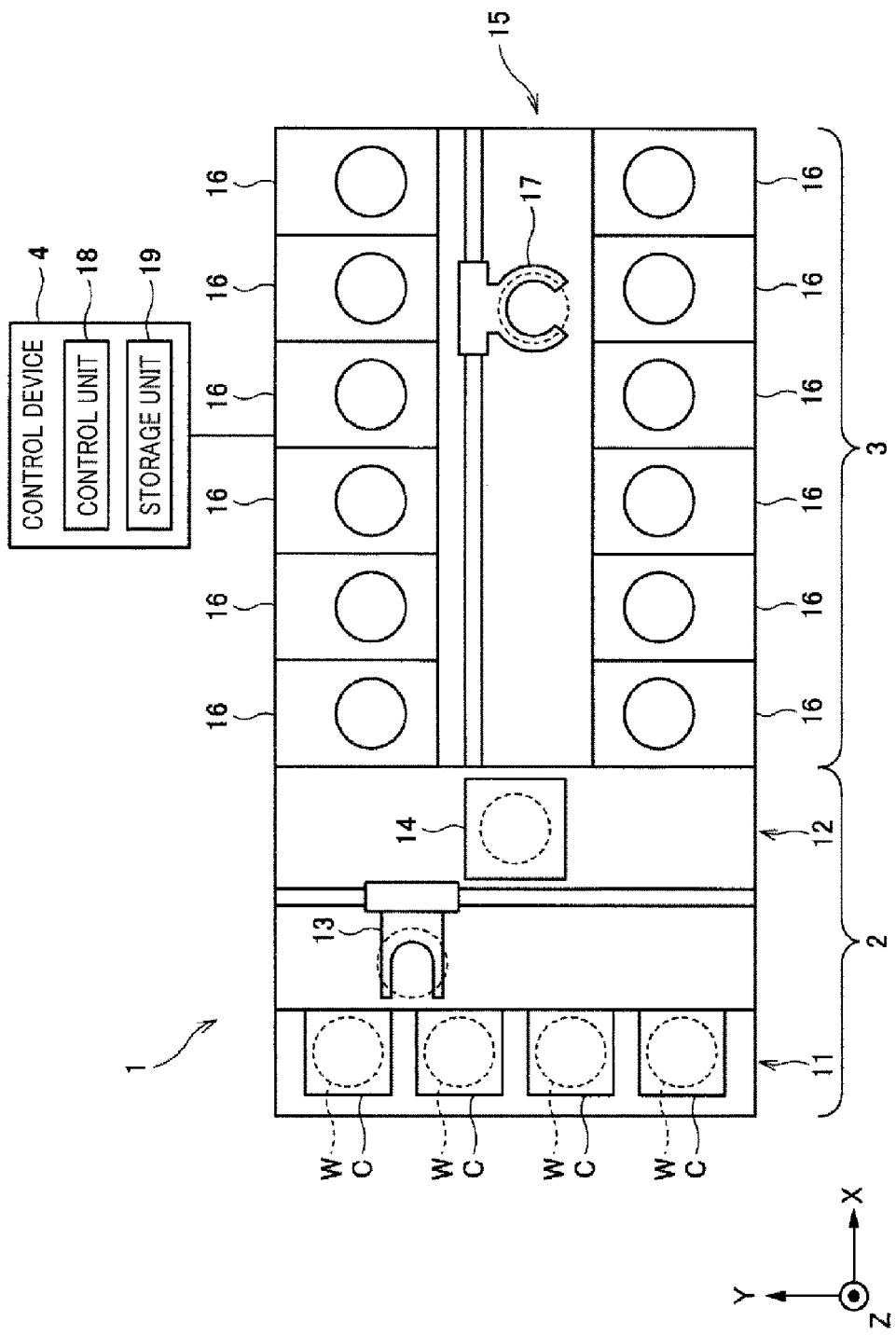
FIG. 1 is a diagram illustrating an outline of a substrate processing system according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments will be described in detail with reference to the accompanying drawings.

FIG. 1 is a plan view illustrating an outline of a substrate processing system provided with a processing unit according to an exemplary embodiment of the present disclosure. In the following, in order to clarify positional relationships, the X-axis, Y-axis and Z-axis which are orthogonal to each other will be defined. The positive Z-axis direction will be regarded as a vertically upward direction.

As illustrated in FIG. 1, a substrate processing system 1 includes a carry-in/out station 2 and a processing station 3. The carry-in/out station 2 and the processing station 3 are provided adjacent to each other.

The carry-in/out station 2 is provided with a carrier placing section 11 and a transfer section 12. In the carrier placing section 11, a plurality of carriers C is placed to accommodate a plurality of substrates (semiconductor wafers in the present exemplary embodiment) (hereinafter, referred to as "wafers W") horizontally.

The transfer section 12 is provided adjacent to the carrier placing section 11, and provided with a substrate transfer device 13 and a delivery unit 14. The substrate transfer device 13 is provided with a wafer holding mechanism configured to hold the wafer W. Further, the substrate transfer device 13 is movable horizontally and vertically and pivotable around a vertical axis, and transfers the wafers W between the carriers C and the delivery unit 14 by using the wafer holding mechanism.

The processing station 3 is provided adjacent to the transfer section 12. The processing station 3 is provided with a transfer section 15 and a plurality of processing units 16. The plurality of processing units 16 is arranged at both sides of the transfer section 15.

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafers W between the delivery unit 14 and the processing units 16 by using the wafer holding mechanism.

The processing units 16 perform a predetermined substrate processing on the wafers W transferred by the substrate transfer device 17.

Further, the substrate processing system 1 is provided with a control device 4. The control device 4 is, for example, a computer, and includes a control unit 18 and a storage unit 19. The storage unit 19 stores a program that controls various processings performed in the substrate processing system 1. The control unit 18 controls the operations of the substrate processing system 1 by reading and executing the program stored in the storage unit 19.

Further, the program may be recorded in a computer-readable recording medium, and installed from the recording medium to the storage unit 19 of the control device 4. The computer-readable recording medium may be, for example, a hard disc (HD), a flexible disc (FD), a compact disc (CD), a magnet optical disc (MO), or a memory card.

In the substrate processing system 1 configured as described above, the substrate transfer device 13 of the carry-in/out station 2 first takes out a wafer W from a carrier C placed in the carrier placing section 11, and then places the taken wafer W on the delivery unit 14. The wafer W placed on the delivery unit 14 is taken out from the delivery unit 14 by the substrate transfer device 17 of the processing station 3 and carried into a processing unit 16.

The wafer W carried into the processing unit 16 is processed by the processing unit 16, and then, carried out from the processing unit 16 and placed on the delivery unit 14 by the substrate transfer device 17. After the processing of placing the wafer W on the delivery unit 14, the wafer W returns to the carrier C of the carrier placing section 11 by the substrate transfer device 13.

A substrate processing apparatus 10 (see FIG. 2 and FIG. 3) to be described below is placed in each processing unit 16. A cleaning processing is performed on the wafer W carried into the processing unit 16 by the substrate processing apparatus 10.

Now, a schematic configuration of the substrate processing apparatus 10 will be explained.

Figure 2:
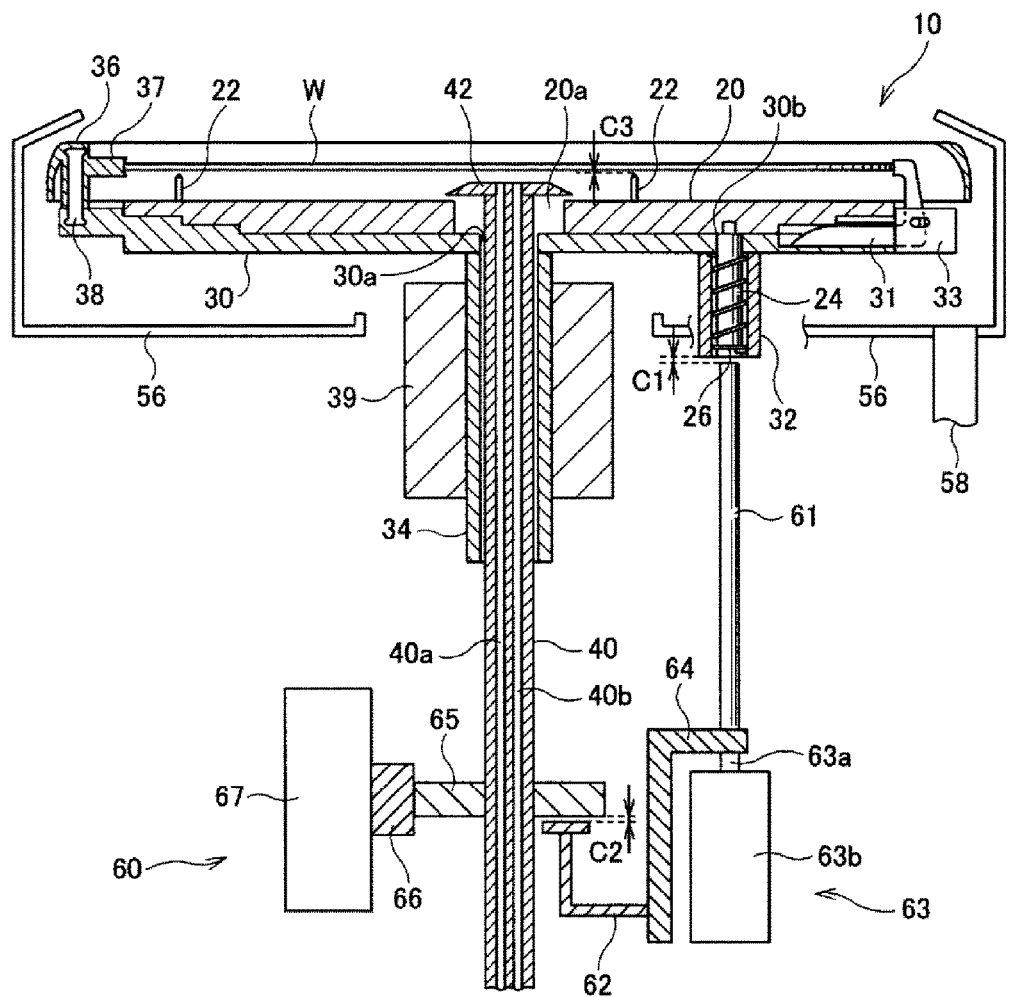
FIG. 2 is a longitudinal cross sectional view illustrating an outline of a substrate processing apparatus, showing a state where a wafer, a holding plate and a liquid supply pipe are placed at a lower position.
Figure 3:
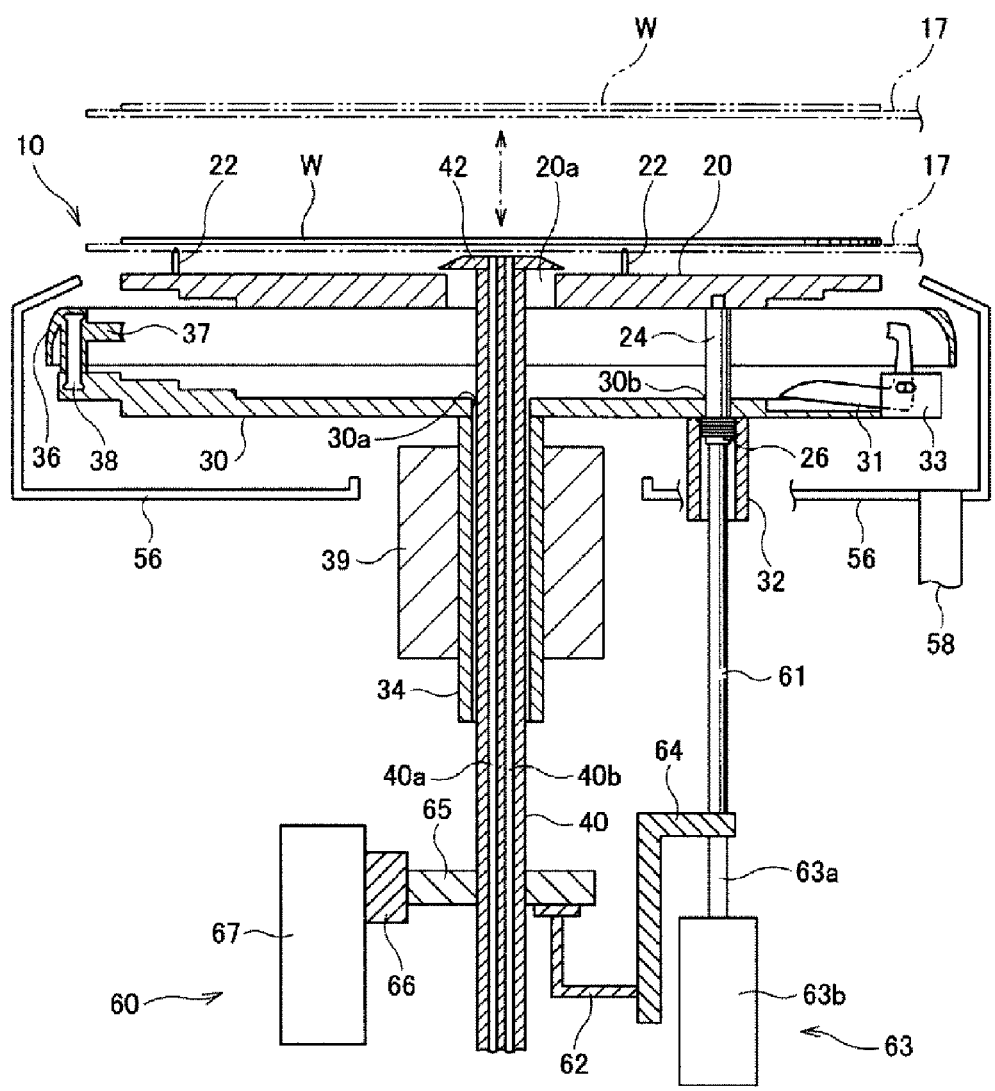
FIG. 3 is a longitudinal cross sectional view illustrating the outline of the substrate processing apparatus, showing a state in which the wafer, the holding plate and the liquid supply pipe are placed at an upper position.

FIG. 2 is a longitudinal cross sectional view showing a schematic configuration of the substrate processing apparatus 10. FIG. 2 illustrates a state in which the wafer W, a holding plate 30 and a liquid supply pipe (liquid supply unit) 40 are placed at a lower position (neighboring position). FIG. 3 is a longitudinal cross sectional view showing a schematic configuration of the substrate processing apparatus 10, and it illustrates a state in which the wafer W, the holding plate 30 and the liquid supply pipe 40 are placed at an upper position (distanced position). Further, for the purpose of clear understanding, some of components (e.g., an elevating device 60 to be descried later) in FIG. 2 and FIG. 3 are functionally illustrated, and specific shapes and arrangement thereof may not necessarily coincide with those illustrated in the figures.

The substrate processing apparatus 10 is equipped with the holding plate 30 configured to hold the wafer W; a lift pin plate 20 having lift pins 22 provided above the holding plate 30 and configured to support the wafer W from below; a rotation driving unit 39 configured to rotate the holding plate 30; and the liquid supply pipe 40 which is inserted through a through hole 30a formed at a central portion of the holding plate 30 and a through hole 20a formed at a central portion of the lift pin plate 20 and is configured to supply a cleaning liquid such as pure water or a chemical liquid to a rear surface of the wafer W held by the holding plate 30.

The lift pin plate 20 and the liquid supply pipe 40 are configured to be movable up and down relatively with respect to the holding plate 30, and the lift pin plate 20 and the liquid supply pipe 40 can be moved up and down between the lower position shown in FIG. 2 and the upper position shown in FIG. 3.

The lift pin plate 20 has a circular plate shape, and three lift pins 22 are provided on a surface of the lift pin plate 20. These lift pins 22 are arranged at a peripheral region of the lift pin plate 20 at a regular distance along a circumferential direction thereof. Further, three bar-shaped connecting members 24 are connected to a rear surface (a surface at an opposite side from where the lift pins 22 are provided) of the lift pin plate 20, and the lift pins 22 are respectively connected to the connecting members 24. Each connecting member 24 is extended downwards from the rear surface of the lift pin plate 20, and these connecting members 24 are arranged at a peripheral region of the lift pin plate 20 at a regular distance along the circumferential direction thereof.

The holding plate 30 has a circulate plate shape, and a rotational cup 36 is connected to a surface of the holding plate 30 via a connection member 38. The rotational cup 36 is configured to surround an edge of the wafer W held by the holding plate 30 when the lift pin plate 20 and the liquid supply pipe 40 are located at the lower position as depicted in FIG. 2. Further, the rotational cup 36 is provided with two fixed holders 37 configured to hold the wafer W.

An outer cup 56 is provided outside the rotational cup 36. The holding plate 30 and the rotational cup 36 are enclosed by the outer cup 56. A drain pipe 58 is connected to the outer cup 56. The cleaning liquid received by the outer cup 56 after being scattered outwards from the wafer W through the rotation of the wafer W is drained out through the drain pipe 58.

A hollow rotation shaft 34 is fixed to a central portion of a rear surface (a surface at an opposite side from where the rotational cup 36 is provided) of the holding plate 30 such that the rotation shaft 34 is extended downwards from the rear surface of the holding plate 30. The liquid supply pipe 40 is accommodated in a hollow portion of the rotation shaft 34. The rotation shaft 34 is rotated by the rotation driving unit 39 via a bearing (not shown) or the like. As the rotation driving unit 39 rotates the rotation shaft 34, the holding plate 30 fixed to the rotation shaft 34 is also rotated.

The holding plate 30 is provided with three through holes (connecting member passing holes) 30b. The bar-shaped three connecting members 24 extended downwards from the rear surface of the lift pin plate 20 respectively pass through the through holes 30b. These through holes 30b are arranged at a regular distance along a circumferential direction of the holding plate 30. Furthermore, three cylindrical accommodation members 32 are provided at positions on the rear surface of the holding plate 30 where the through holes 30b are provided. Each accommodation member 32 is extended downwards from the rear surface of the holding plate 30, and accommodates therein each corresponding connecting member 24 extended downwards from the rear surface of the lift pin plate 20. These accommodation members 32 are arranged at a peripheral region of the holding plate 30 at a regular distance along the circumferential direction thereof.

An inner diameter of each cylindrical accommodation member 32 is slightly larger than an outer diameter of each corresponding connecting member 24, and each connecting member 24 can be moved within each corresponding accommodation member 32 in a lengthwise direction (an up-and-down direction in FIG. 2 and FIG. 3) of the accommodation member 32. As depicted in FIG. 2, when the lift pin plate 20 is located at the lower position, each connecting member 24 is completely accommodated in each corresponding accommodation member 32. Meanwhile, when the lift pin plate 20 is located at the upper position as shown in FIG. 3, only a part of a lower portion of each connecting member 24 is accommodated in each corresponding accommodation member 32, and each connecting member 24 is protruded upwards from each corresponding through hole 30b of the holding plate 30. In this configuration, if the holding plate 30 is rotated by the rotation driving unit 39, each accommodation member 32 and each connecting member 24 are moved along with the holding plate 30, so that the lift pin plate 20 is also rotated.

A spring (elastic body) 26 is accommodated in a hollow portion of each accommodation member 32 in a compressed state. A lower end of this spring 26 is connected to a lower end portion of the connecting member 24, and an upper end of the spring 26 is connected to a bottom surface of the holding plate 30 in the vicinity of the through hole 30b. Accordingly, the spring 26 exerts a downward elastic force to the connecting member 24, so that the lift pin plate 20 (lift pins 22) is forced downwards. That is, a downward force (a force directed downwards from the holding plate 30) is always applied to the connecting member 24 by a force by which the spring 26 returns to an original state from the compressed state.

The holding plate 30 is equipped with a substrate supporting member 31 configured to support the wafer W from a lateral side. To elaborate, a bearing 33 is mounted to the holding plate 30, and the substrate supporting member 31 is axially supported at the bearing 33. The substrate supporting member 31 is pivoted around a supporting shaft by being forced in a clockwise direction of FIG. 2 and FIG. 3 through a non-illustrated spring and by being pressed through the lift pin plate 20. This substrate supporting member 31 supports the wafer W from the lateral side when the lift pin plate 20 is located at the lower position as shown in FIG. 2, and is spaced apart from the wafer W when the lift pin plate 20 is located at the upper position as shown in FIG. 3. To be more specific, when a cleaning processing of the wafer W is performed, the wafer W is held by the substrate supporting member 31 and the two fixed holders 37. At this time, the substrate supporting member 31 presses the wafer W toward the fixed holders 37.

The liquid supply pipe 40 is inserted through the through hole 20a of the lift pin plate 20 and the through hole 30a of the holding plate 30. Further, the liquid supply pipe 40 is not rotated even when the lift pin plate 20 and the holding plate 30 are rotated. A single or a plurality of cleaning liquid supply paths through which the cleaning liquid such as the pure water or the chemical liquid flows is provided within the liquid supply pipe 40. Though two cleaning liquid supply paths 40a and 40b are shown in FIG. 2 and FIG. 3, four cleaning liquid supply paths, for example, may be actually provided within the liquid supply pipe 40. A head portion 42 is provided at a leading end portion of the liquid supply pipe 40. This head portion 42 has a shape similar to a circular plate shape and is provided to close the through hole 20a of the lift pin plate 20. The head portion 42 may be provided with a single or a plurality of nozzles. By way of non-limiting example, the head portion 42 may have four nozzles. Each nozzle provided at the head portion 42 communicates with each cleaning liquid supply path provided within the liquid supply pipe 40. The cleaning liquid such as the pure water or the chemical liquid sent to the nozzle from each corresponding cleaning liquid supply path is discharged toward the rear surface of the wafer W from the corresponding nozzle. Furthermore, in addition to the cleaning liquid supply paths through which the cleaning liquid such as the pure water or the chemical liquid flows, the liquid supply pipe 40 may be further provided with a gas supply path through which a gas such as a $N_2$ gas flows. Moreover, a gas as well as the cleaning liquid may be sent into the cleaning liquid supply path of the liquid supply pipe 40. The gas sent into the gas supply path or the cleaning liquid supply path of the liquid supply pipe 40 is discharged toward the wafer W from the corresponding nozzle at the head portion.

Further, specific configurations and operations of the individual components of the above-described substrate processing apparatus 10 may be the same as those of a substrate cleaning apparatus described in, for example, Japanese Patent Laid-open Publication No. 2013-254959.

The substrate processing apparatus 10 is further equipped with the elevating device 60 configured to move the lift pin plate 20 and the liquid supply pipe 40 up and down relatively with respect to the holding plate 30. The lift pin plate 20 and the liquid supply pipe 40 are moved up and down by the elevating device 60 to be switched between a neighboring state (FIG. 2) where the lift pin plate 20 and the liquid supply pipe 40 are adjacent to the holding plate 30 and a distanced state (FIG. 3) where the lift pin plate 20 and the liquid supply pipe 40 are distanced upwards from the holding plate 30. That is, the elevating device 60 moves the lift pins 22 and the liquid supply pipe 40 between the neighboring positions where the lift pins 22 and the liquid supply pipe 40 are placed adjacent to the holding plate 30 and the wafer W is held by the holding plate 30 and the distanced positions where the lift pins 22 and the liquid supply pipe 40 are upwardly spaced apart from the holding plate 30 and the wafer W is carried out.

To elaborate, the elevating device 60 includes a first lifting member 61, a second lifting member 62, an elevation driving unit 63, an intermediate joint member 64, a fixed elevating member 65, a guide member 66 and a guide restriction member 67.

The first lifting member 61 may be switched between a connected state and a disconnected state with respect to the lift pin plate 20. In the present exemplary embodiment, the first lifting member 61 is connected to the lift pin plate 20 (lift pins 22) by being brought into contact with the connecting member 24, and is disconnected from the lift pin plate 20 (lift pins 22) by being separated from the connecting member 24. When the lift pin plate 20 and the liquid supply pipe 40 are located at the neighboring position, the first lifting member 61 may be in the disconnected state with respect to the lift pins 22 and the lift pin plate 20 (see FIG. 2). When the first lifting member 61 is not connected to the lift pin plate 20, the spring 26 forces the lift pin plate 20 (lift pins 22) downwards via the connecting member 24, and the lift pin plate 20 is maintained in the neighboring state (see FIG. 2). Further, when the first lifting member 61 is connected to the lift pin plate 20, the first lifting member 61 lifts the lift pin plate 20 upwards against the elastic force of the spring 26, so that the lift pin plate 20 (lift pins 22) may be moved to the distanced position (see FIG. 3). As stated above, the first lifting member 61 is capable of raising the lift pin plate 20 (lift pins 22) by pushing the connecting member 24 upwards against the elastic force of the spring 26 and is also capable of lowering the lift pin plate 20 by lowering a pushup position of the connecting member 24.

Since the second lifting member 62 is configured to be switched between a connected state and a disconnected state with respect to the liquid supply pipe 40, the second lifting member 62 can move the liquid supply pipe 40 to the distanced position. The second lifting member 62 according to the present exemplary embodiment is connected to the liquid supply pipe 40 by being brought into contact with the fixed elevating member 65, and is disconnected from the liquid supply pipe 40 by being separated from the fixed elevating member 65. Further, the fixed elevating member 65 is fixed to an outer peripheral portion of the liquid supply pipe 40 and is configured to be moved up and down as one body with the liquid supply pipe 40.

The elevation driving unit 63 is configured to move the first lifting member 61 and the second lifting member 62 up and down. In the present exemplary embodiment, the first lifting member 61 and the second lifting member 62 are connected to the intermediate joint member 64. The elevation driving unit 63 is capable of moving the first lifting member 61 and the second lifting member 62 up and down by moving the intermediate joint member 64 up and down. The illustrated elevation driving unit 63 includes an air cylinder having a piston 63a and a cylinder 63b. The piston 63a is connected to the intermediate joint member 64, and the intermediate joint member 64 can be moved up and down according to a protrusion amount of the piston 63a from the cylinder 63b. Furthermore, the elevation driving unit 63 is controlled by the control device 4 shown in FIG. 1 or another control device (not shown) separately provided, and an elevation timing and an elevation amount of the piston 63a and the like are determined by this control device.

The guide member 66 is fixed to the fixed elevating member 65 and is also connected to the liquid supply pipe 40 via the fixed elevating member 65. The guide member 66 is moved up and down as one body with the liquid supply pipe 40 and the fixed elevating member 65. The guide restriction member 67 holds the guide member 66 to be movable up and down. Particularly, the guide restriction member 67 restricts a movement of the guide member 66 such that the guide member 66 is not lowered below a preset lowermost position. Accordingly, when the second lifting member 62 descends, the second lifting member 62, the fixed elevating member 65, the liquid supply pipe 40 and the guide member 66 are moved down as one body until the guide member 66 reaches the preset lowermost position. Meanwhile, if the second lifting member 62 is further lowered after the guide member 66 reaches the lowermost position, since the liquid supply pipe 40, the fixed elevating member 65 and the guide member 66 are stopped at the lowermost position by being restricted through the guide restriction member 67, the second lifting member 62 is separated from the fixed elevating member 65. As a result, the second lifting member 62 is disconnected from the liquid supply pipe 40.

In the elevating device 60 having the above-described configuration, by moving the first lifting member 61 and the second lifting member 62 up and down through the elevation driving unit 63, it is possible to create "a state (see FIG. 2) where the first lifting member 61 is not connected to the lift pin plate 20 (lift pins 22) and the second lifting member 62 is not connected to the liquid supply pipe 40" and "a state (see FIG. 3) where the first lifting member 61 is connected to the lift pin plate 20 (lift pins 22) and the second lifting member 62 is connected to the liquid supply pipe 40."

Meanwhile, an ascending start timing of the lift pin plate 20 and an ascending start timing of the liquid supply pipe 40 are determined based on a clearance C1 between the first lifting member 61 and the connecting member 24 and a clearance C2 between the second lifting member 62 and the fixed elevating member 65.

That is, the ascending start timing of the lift pin plate 20 is determined based on a timing when the first lifting member 61 comes into contact with the connecting member 24. Further, the ascending start timing of the liquid supply pipe 40 is determined based on a timing when the second lifting member 62 comes into contact with the fixed elevating member 65. In the meantime, the first lifting member 61 and the second lifting member 62 are elevated as one body with the intermediate joint member 64 therebetween, and the elevation timing of the first lifting member 61 coincides with the elevation timing of the second lifting member 62. Accordingly, when the first lifting member 61 and the second lifting member 62 are located at the lower positions and the lift pin plate 20 and the liquid supply pipe 40 are in the aforementioned neighboring state (see FIG. 2), the relative relationship between the ascending start timing of the lift pin plate 20 and the ascending start timing of the liquid supply pipe 40 is determined based on a difference between the clearance C1 between the first lifting member 61 and the connecting member 24 and the clearance C2 between the second lifting member 62 and the fixed elevating member 65.

By way of example, if the clearance C1 between the first lifting member 61 and the connecting member 24 is set to be smaller than the clearance C2 between the second lifting member 62 and the fixed elevating member 65 (that is, "C1<C2"), as the intermediate joint member 64 is raised, the first lifting member 61 first comes into contact with the connecting member 24, and, then, the second lifting member 62 comes into contact with the fixed elevating member 65. In this case, the lift pin plate 20 first starts to be moved up, and then, the liquid supply pipe 40 starts to be moved up. Meanwhile, if the clearance C1 between the first lifting member 61 and the connecting member 24 is set to be larger than the clearance C2 between the second lifting member 62 and the fixed elevating member 65 (that is, "C1>C2"), as the intermediate joint member 64 is raised, the second lifting member 62 first comes into contact with the fixed connecting portion 65, and, then, the first lifting member 61 comes into contact with the connecting member 24. In this case, the liquid supply pipe 40 first starts to be to be moved up, and then, the lift pin plate 20 starts to be moved up. Furthermore, if the clearance C1 between the first lifting member 61 and the connecting member 24 is set to be equal to the clearance C2 between the second lifting member 62 and the fixed elevating member 65 (that is, "C1=C2"), the contact between the second lifting member 62 and the fixed elevating member 65 and the contact between the first lifting member 61 and the connecting member 24 occur concurrently as the intermediate joint member 64 is moved up. In this case, the lift pin plate 20 and the liquid supply pipe 40 start to be moved up at the same time.

In general, from the viewpoint of suppressing contamination of the wafer W caused by a residual liquid at the head portion 42, it may be effective for the head portion 42 not to be close to the rear surface of the wafer W. If, however, the liquid supply pipe 40 is raised before the wafer W is raised, the head portion 42 of the liquid supply pipe 40 gets close to the rear surface of the wafer W. In view of this, in order to suppress the liquid supply pipe 40 from being started to be moved up before the lift pin plate 20 configured to lift the wafer W is started to be moved up, it is desirable to satisfy the aforementioned relationship of "C1=C2" or "C1<C2".

Further, when the first lifting member 61 and the second lifting member 62 are located at the lower positions and the lift pin plate 20 and the liquid supply pipe 40 are in the aforementioned neighboring state (see FIG. 2), a relative relationship between the ascending start timing of the lift pin plate 20 and an ascending start timing of the wafer W is determined based on a difference between the clearance C1 between the first lifting member 61 and the connecting member 24 and a clearance C3 between each lift pin 22 and the wafer W. Thus, a relative relationship between the ascending start timing of the wafer W and the ascending start timing of the liquid supply pipe 40 is determined based on a difference between a sum of the clearance C1 and the clearance C3 (that is, "C1+C3") and the clearance C2. Therefore, in order to suppress the head portion 42 of the liquid supply pipe 40 from being positioned close to the rear surface of the wafer W, it is desirable to satisfy the relationship of "(C1+C3)=C2" or "(C1+C3)<C2." Especially, if a distance between the head portion 42 of the liquid supply pipe 40 and the rear surface of the wafer W needs to be maintained constant regardless of the elevated positions of the liquid supply pipe 40 and the wafer W, it is desirable that the relationship of "(C1+C3)=C2" should be satisfied.

Moreover, if each lift pin 22 is kept in contact with the wafer W and the clearance C3 is zero (that is, "C3=0") when the lift pin plate 20 and the liquid supply pipe 40 are in the above-described neighboring state (see FIG. 2), it is desirable to satisfy the relationship of "C1=C2" or "C1<C2" as stated above.

In the present exemplary embodiment, when the lift pin plate 20 (lift pins 22) and the liquid supply pipe 40 are moved from the neighboring position (see FIG. 2) to the distanced position (see FIG. 3) under the condition where the relationship of "(C1+C3)=C2" is satisfied, the connection of the second lifting member 62 to the liquid supply pipe 40 and the connection of the lift pins 22 to the wafer W (that is, the connection of the first lifting member 61 to the wafer W with the lift pin plate 20 (lift pins 22) therebetween) are performed at the same time.

Now, an ascending (moving up) operation flow in which the lift pin plate 20 and the liquid supply pipe 40 are moved from the neighboring position (see FIG. 2) to the distanced position (see FIG. 3) will be explained. Here, a detailed description of a descending operation flow in which the lift pin plate 20 and the liquid supply pipe 40 are moved from the distanced position (see FIG. 3) to the neighboring position (see FIG. 2) is omitted. Basically, however, the descending operation is performed in the reverse sequence to that of the ascending operation to be described below.

FIG. 4 is a flowchart showing an example of the ascending operation flow.

When the lift pins 22 (the lift pin plate 20) and the liquid supply pipe 40 are moved from the neighboring position (see the lower position of FIG. 2) to the distanced position (see the upper position of FIG. 3), the first lifting member 61 is turned from the disconnected state into the connected state where the first lifting member 61 is connected to the lift pins 22. In the state that the first lifting member 61 is connected to the lift pins 22, the elevating device 60 raises only the lift pin plate 20 (lift pins 22) between the lift pin plate 20 and the liquid supply pipe 40 for a time during which the first lifting member 61 is raised to a preset position between the neighboring position and the distanced position. Here, the "preset position" corresponds to a position where the lift pins 22 come into contact with the rear surface of the wafer W. Then, for a time during which the first lifting member 61 is raised from the preset position to the distanced position through being raised above the preset position by the elevating device 60, the lift pin plate 20 (lift pins 22) and the liquid supply pipe 40 are moved up together.

That is, while a liquid processing is being performed on the wafer W by the substrate processing apparatus 10 or immediately before or after the liquid processing, the lift pin plate 20 and the liquid supply pipe 40 are in the aforementioned neighboring state, and the first lifting member 61 is located at the position downwardly spaced apart from the connecting member 24 and the second lifting member 62 is located at the position downwardly spaced apart from the fixed elevating member 65 (see FIG. 2). Accordingly, the first lifting member 61 is not connected to the lift pin plate 20 (lift pins 22), and the second lifting member 62 is not connected to the liquid supply pipe 40 (S11 of FIG. 4). Further, in this case, the lift pins 22 and the liquid supply pipe 40 are stopped, and the lift pins 22 are located at positions downwardly spaced apart from the wafer W.

As the elevation driving unit 63 elevates the intermediate joint member 64 upwards, the first lifting member 61 is brought into contact with the connecting member 24 and is connected to the lift pin plate 20 (lift pins 22) with the connecting member 24 therebetween, and the lift pin plate 20 (lift pins 22) is begun to be moved up (S12). At this moment, the lift pins 22 are not in contact with the wafer W, and the second lifting member 62 is not in contact with the fixed elevating member 65, and thus, the liquid supply pipe 40 is stopped.

As the lift pin plate 20 is raised up, the lift pins 22 come into contact with the rear surface of the wafer W. Further, at the same time when the lift pins 22 come into contact with the wafer W, the second lifting member 62 comes into contact with the fixed elevating member 65. That is, the connection of the first lifting member 61 to the lift pins 22 and the connection of the second lifting member 62 to the liquid supply pipe 40 are performed at the same time (S13). Then, the wafer W and the liquid supply pipe 40 start to be raised at the same time (S14).

As shown in the sequence from S12 to S14, it is desirable to start the ascending of the liquid supply pipe 40 after the ascending of the lift pins 22 is begun. Particularly, it may be more desirable to begin the ascending of the liquid supply pipe 40 at the moment the wafer W comes into contact with the lift pins 22 and is begun to be raised. In this way, the clearance between the wafer W and the liquid supply pipe 40 can be suppressed from getting smaller.

Further, as the intermediate joint member 64 is moved up by the elevation driving unit 63 in the state where the first lifting member 61 is connected to the wafer W and the second lifting member 62 is connected to the liquid supply pipe 40, the wafer W and the liquid supply pipe 40 are raised together up to the upper positions (see FIG. 3) which is the distanced position (that is, where the carry-in/out of the wafer W is performed) while maintaining the size of the clearance between the wafer W and the liquid supply pipe 40, and are stopped at the upper position (S15).

As stated above, according to the substrate processing apparatus and the substrate processing method of the present exemplary embodiment, the first lifting member 61 and the second lifting member 62 are connected to the intermediate joint member 64, and this intermediate joint member 64 is moved up and down by the elevation driving unit 63. Accordingly, the wafer W and the liquid supply pipe 40 can be moved up and down by the single elevating device 60. Furthermore, since the ascending start timing of the wafer W and the ascending start timing of the liquid supply pipe 40 are adjusted in the ascending operation by adjusting the clearances (see "C1", "C2" and "C3" in FIG. 1) between the components, it is possible to suppress the decrease of the clearance between the rear surface of the wafer W and the head portion 42 of the liquid supply pipe 40 in the ascending operation. Therefore, the adhesion of the cleaning liquid remaining at the head portion 42 of the liquid supply pipe 40 to the rear surface of the wafer W can be effectively avoided, so that the contamination of the wafer W by the residual liquid can be suppressed.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate processing apparatus, comprising:
   a holding plate provided with a first through hole and configured to hold a substrate;
   a rotation driving unit configured to rotate the holding plate;
   a lift pin provided above the holding plate and configured to support the substrate from below;
   a liquid supply unit provided to pass through the first through hole and configured to supply a liquid to a rear surface of the substrate held by the holding plate; and
   an elevating device configured to move the lift pin and the liquid supply unit up and down between at a neighboring position where the lift pin and the liquid supply unit are adjacent to the holding plate and the substrate is held and at a distanced position where the lift pin and the liquid supply unit are distanced upwards from the holding plate and the substrate is carried out,
   wherein the elevating device comprises a first lifting member configured to move the lift pin to the distanced position,
   the first lifting member is in a disconnected state with respect to the lift pin when the lift pin and the liquid supply unit are located at the neighboring position, and
   when the lift pin and the liquid supply unit are moved from the neighboring position to the distanced position, the first lifting member is turned from the disconnected state to a connected state where the first lifting member is connected to the lift pin, and the elevating device raises only the lift pin without raising the liquid supply unit for a time during which the first lifting member is moved up to a preset position, where the lift pin comes into contact with the rear surface of the substrate, while being connected to the lift pin, and raises the lift pin and the liquid supply unit for a time during which the first lifting member is raised from the preset position to the distanced position.

2. The substrate processing apparatus of claim 1, wherein the elevating device further comprises:
   a second lifting member configured to move the liquid supply unit to the distanced position; and
   an elevation driving unit configured to move the first lifting member and the second lifting member up and down,
   wherein the elevation driving unit creates, by moving the first lifting member and the second lifting member up and down, a state where the first lifting member is not connected to the lift pin and the second lifting member is not connected to the liquid supply unit and a state where the first lifting member is connected to the lift pin and the second lifting member is connected to the liquid supply unit.

3. The substrate processing apparatus of claim 2, wherein the elevating device further comprises an intermediate joint member connected to the first lifting member and the second lifting member, and
   the elevation driving unit moves the first lifting member and the second lifting member up and down by moving the intermediate joint member up and down.

4. The substrate processing apparatus of claim 2, further comprising:

a fixed elevating member fixed to the liquid supply unit and configured to be moved up and down as one body with the liquid supply unit, wherein the second lifting member is connected to the liquid supply unit by being brought into contact with the fixed elevating member and is disconnected from the liquid supply unit by being separated from the fixed elevating member.

5. The substrate processing apparatus of claim 2, wherein when the lift pin and the liquid supply unit are moved from the neighboring position to the distanced position, the connection of the second lifting member to the liquid supply unit and the connection of the first lifting member to the substrate with the lift pin therebetween are performed at the same time.

6. The substrate processing apparatus of claim 2, wherein the elevation driving unit includes an air cylinder.

7. The substrate processing apparatus of claim 1, further comprising:
a guide member connected to the liquid supply unit and configured to be moved up and down as one body with the liquid supply unit; and
a guide restriction member configured to hold the guide member to be moved up and down and restrict a movement of the guide member to suppress the guide member from being moved to a position below a preset lowermost position.

8. The substrate processing apparatus of claim 1, further comprising:
a connecting member connected to the lift pin,
wherein the first lifting member is connected to the lift pin by being brought into contact with the connecting member and is disconnected from the lift pin by being separated from the connecting member.

9. The substrate processing apparatus of claim 8, further comprising:
a spring configured to force the lift pin such that the lift pin is maintained at the neighboring position,
wherein the spring forces the lift pin by applying an elastic force to the connecting member, and
the first lifting member raises the lift pin by lifting the connecting member upwards against the elastic force applied by the spring.

* * * * *